US012775445B2

(12) United States Patent
Hwang et al.

(10) Patent No.: US 12,775,445 B2
(45) Date of Patent: Oct. 27, 2026

(54) FULL ADDER INTEGRATED CIRCUIT AND 4-2 COMPRESSOR INTEGRATED CIRCUIT BASED ON THE FULL ADDER INTEGRATED CIRCUIT

(71) Applicant: SAMSUNG ELECTRONICS CO., LTD., Suwon-si (KR)

(72) Inventors: Hyunchul Hwang, Suwon-si (KR); Hyun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1099 days.

(21) Appl. No.: 17/509,505

(22) Filed: Oct. 25, 2021

(65) Prior Publication Data

US 2022/0236950 A1 Jul. 28, 2022

(30) Foreign Application Priority Data

Jan. 22, 2021 (KR) ........................ 10-2021-0009757

(51) Int. Cl.
*G06F 7/501* (2006.01)
*H03K 19/20* (2006.01)
*G06F 7/57* (2006.01)

(52) U.S. Cl.
CPC ............. *G06F 7/501* (2013.01); *H03K 19/20* (2013.01); *G06F 7/57* (2013.01)

(58) Field of Classification Search
CPC .......... G06F 7/501; G06F 7/503; H03K 19/20
See application file for complete search history.

(56) References Cited

U.S. PATENT DOCUMENTS

| | | | |
|---|---|---|---|
| 4,831,578 | A | 5/1989 | Bui |
| 6,029,187 | A | 2/2000 | Verbauwhede |
| 7,191,205 | B2 | 3/2007 | Nakaya |
| 7,483,935 | B2 | 1/2009 | Hansen et al. |
| 9,239,703 | B2 | 1/2016 | Kim |
| 10,613,829 | B2 | 4/2020 | Srivastava et al. |
| 10,620,915 | B2 | 4/2020 | Wei et al. |
| 10,628,543 | B1 | 4/2020 | Vanukuri et al. |

(Continued)

FOREIGN PATENT DOCUMENTS

| | | | |
|---|---|---|---|
| JP | S61-148530 | A | 7/1986 |
| JP | H11-154078 | A | 6/1999 |

(Continued)

OTHER PUBLICATIONS

McAllister, Willy, "DeMorgan's theorem for basic gates", Spinning Numbers. Retrieved from internet archive dated Jul. 30, 2021. URL: https://spinningnumbers.org/a/demorgan3.html (Year: 2021).*

(Continued)

*Primary Examiner* — Andrew Caldwell
(74) *Attorney, Agent, or Firm* — Morgan, Lewis & Bockius LLP

(57) ABSTRACT

An adder integrated circuit includes a first logic gate group that outputs a first internal signal and a second internal signal based on a first input signal and a second input signal, a second logic gate group that outputs a sum signal based on the second internal signal and a third input signal, and a third logic gate group that outputs a carry signal based on the first internal signal, the second internal signal, and the third input signal.

18 Claims, 18 Drawing Sheets

(56) References Cited

U.S. PATENT DOCUMENTS

| | | | | |
|---|---|---|---|---|
| 2007/0188355 | A1 | 8/2007 | Baek | |
| 2019/0354347 | A1* | 11/2019 | Srivastava ............ | G06F 7/5016 |
| 2021/0124559 | A1* | 4/2021 | Elkin .................... | G06F 7/5318 |

FOREIGN PATENT DOCUMENTS

| | | |
|---|---|---|
| KR | 10-1998-0041223 A | 8/1998 |
| KR | 10-2000-0026572 | 5/2000 |
| KR | 10-1015122 | 2/2011 |
| KR | 10-1967872 | 4/2019 |

OTHER PUBLICATIONS

Rosen, Kenneth H., "Discrete Mathematics and Its Applications", 8th Ed., McGraw-Hill, 2019. (Year: 2019).*

Armenti, Craig, "Circuit Modular Reuse Best Practices", Zuken blog. Retrieved from internet archive dated Aug. 1, 2021. URL: https://www.zuken.com/en/blog/circuit-modular-reuse-best-practices/ (Year: 2021).*

P. Lin, et al., "Analog Placement Based on Symmetry-Island Formulation", IEEE Transactions on Computer-Aided Design of Integrated Circuits and Systems, vol. 28, No. 6, Jun. 2009. (Year: 2009).*

"Symmetry." Merriam-Webster.com Dictionary, Merriam-Webster, https://www.merriam-webster.com/dictionary/symmetry. Nov. 20, 2018. (Year: 2018).*

Office Action dated Apr. 9, 2025 issued in corresponding Korean Patent Application No. 10-2021-009757.

Notice of Allowance issued Oct. 29, 2025 in corresponding Korean Patent Application No. 10-2021-009757 with partial English machine translation.

* cited by examiner

FIG. 4

| INPUT_A | INPUT_B | INPUT_C | SIG_A | SIG_B | CARRY | SUM |
|---|---|---|---|---|---|---|
| 0 | 0 | 0 | 1 | 1 | 0 | 0 |
| 0 | 0 | 1 | 1 | 1 | 0 | 1 |
| 0 | 1 | 0 | 1 | 0 | 0 | 1 |
| 0 | 1 | 1 | 1 | 0 | 1 | 0 |
| 1 | 0 | 0 | 1 | 0 | 0 | 1 |
| 1 | 0 | 1 | 1 | 0 | 1 | 0 |
| 1 | 1 | 0 | 0 | 1 | 1 | 0 |
| 1 | 1 | 1 | 0 | 1 | 1 | 1 |

FULL ADDER INTEGRATED CIRCUIT AND 4-2 COMPRESSOR INTEGRATED CIRCUIT BASED ON THE FULL ADDER INTEGRATED CIRCUIT

CROSS-REFERENCE TO RELATED APPLICATION

This non-provisional U.S. Patent application claims priority under 35 U.S.C. § 119 to Korean Patent Application No. 10-2021-0009757, filed on Jan. 22, 2021, in the Korean Intellectual Property Office, the disclosure of which is incorporated by reference in its entirety herein.

TECHNICAL FIELD

The inventive concept relates to a full adder integrated circuit and a 4-2 compressor integrated circuit, and more particularly, to a 4-2 compressor integrated circuit based on a full adder integrated circuit.

DISCUSSION OF RELATED ART

An Arithmetic logic unit (ALU) is a part of a processor that carries out arithmetic and logic operations on operands in computer instructions. Examples of the processor may include a central processing unit (CPU), a graphics processing unit (GPU), and a neural processing unit (NPU).

An ALU includes various types of complex multipliers, and each of the complex multipliers includes a plurality of full adders. A computational execution speed and power consumption of the processor may be determined according to the types and characteristics of full adders included in the complex multipliers. That is, a fast and low power full adder may affect the computational execution speed and power consumption of a processor.

SUMMARY

At least one embodiment of the inventive concept provides an adder integrated circuit and a 4-2 compressor integrated circuit, which is used to provide a processor having a high computational execution speed.

According to an embodiment of the inventive concept, there is provided an adder integrated circuit including a first logic gate group, a second logic gate group, and a third logic gate group. The first logic gate group outputs a first internal signal and a second internal signal based on a first input signal and a second input signal. The second logic gate group outputs a sum signal based on the second internal signal and a third input signal. The third logic gate group outputs a carry signal based on the first internal signal, the second internal signal, and the third input signal.

According to an embodiment of the inventive concept, there is provided a 4-2 compressor integrated circuit. The 4-2 compressor integrated circuit includes a first adder and a second adder. The first adder generates a first internal signal and a second internal signal with respect to a first input signal and a second input signal and outputs a first carry bit based on the first internal signal, the second internal signal, and a third input signal, and a second adder that generates a third internal signal and a fourth internal signal with respect to a fourth input signal and a fifth input signal, outputs a second carry bit based on the third internal signal, the fourth internal signal, and an internal sum bit of the first adder, and outputs the sum bit based on the internal sum bit and the fourth internal signal.

According to an embodiment of the inventive concept, there is provided a 4-2 compressor integrated circuit including a first region and a second region. The first region includes a first negative AND (NAND) sub-region, a first OR-AND-Inverter (OAI) sub-region, a second OAI sub-region, and a first exclusive negative OR (XNOR) sub-region. The second region includes a second NAND sub-region, a third OAI sub-region, a fourth OAI sub-region, and a second XNOR sub-region. The second OAI region outputs a first carry signal based on a first internal signal and a second internal signal, which are generated in the first region, and a third input signal received from the outside. The fourth OAI sub-region outputs a second carry signal based on a third internal signal and a fourth internal signal, which are generated in the second region, and an internal sum signal generated in the first region. The second XNOR sub-region outputs a sum signal based on the fourth internal signal and the internal sum signal.

According to an embodiment of the inventive concept, there is provided an adder integrated circuit including a first negative AND (NAND) gate, a first OR-AND-Inverter (OAI) gate, an XNOR gate, and a second OAI gate. The first NAND gate is configured to perform a NAND operation on a first input signal and a second input signal to output a first internal signal. The first OAI gate is configured to perform an exclusive negative OR (XNOR) operation on the first input signal and the second input signal based on the first internal signal, the first input signal, and a second input signal, to generate a second internal signal. The XNOR gate is configured to perform an XNOR operation on the second internal signal and a third input signal to generate a sum signal. The second OR-AND-Inverter (OAI) gate outputs a carry signal based the third input signal inverted, the first internal signal, and the second internal signal.

BRIEF DESCRIPTION OF THE DRAWINGS

Embodiments of the inventive concept will be more clearly understood from the following detailed description taken in conjunction with the accompanying drawings in which:

FIG. 4 is a table showing a first internal signal, a second internal signal, a carry signal, and a sum signal, which are output according to logic states of a first input signal to a third input signal input to the adder integrated circuit according to an embodiment of the inventive concept;

DETAILED DESCRIPTION OF THE EMBODIMENTS

Hereinafter, embodiments of the inventive concept will be described in detail with reference to the accompanying drawings.

Figure 1:
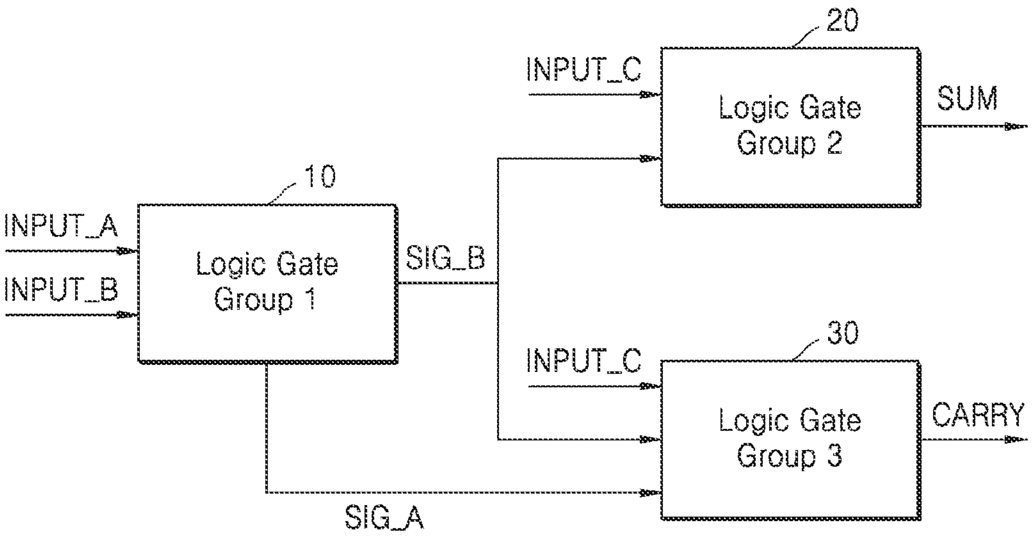
FIG. 1 is a block diagram illustrating logic gate groups of an adder integrated circuit according to an embodiment of the inventive concept.

FIG. 1 is a block diagram illustrating logic gate groups (e.g., groups of logic gate circuits) of an adder integrated circuit according to an embodiment of the inventive concept.

Referring to FIG. 1, the adder integrated circuit according to an embodiment of the inventive concept may include a first logic gate group 10 (e.g., a first group of logic gate circuits), a second logic gate group 20 (e.g., a second group of logic gate circuits), and a third logic gate group 30 (e.g., a third group of logic gate circuits). Each logic gate group may include a combination of at least one logic gate (e.g., at least logic gate circuit), and may generate an output signal by performing a logic operation on an input signal. The logic gate may include a plurality of transistors and receive at least one input signal to generate an output signal by performing a logic operation using the plurality of transistors. Examples of the logic gate may include AND, OR, exclusive OR (XOR), negation (NOT), negative AND (NAND), negative OR (NOR), and exclusive negative OR (XNOR) gates. A combination of transistors constituting each logic gate may vary, and a combination of transistors constituting the logic gate may be determined according to an operation speed, degree of integration, or the number of transistors, which is required in an integrated circuit.

The adder integrated circuit according to an embodiment of the inventive concept may receive a first input signal INPUT_A, a second input signal INPUT_B, and a third input signal INPUT_C to generate a sum signal and a carry signal. The first input signal INPUT_A to the third input signal INPUT_C are signals input from the outside and may be exemplarily received from a host device. However, at least one of the first input signals INPUT_A to the third input signals INPUT_C may be a carry signal CARRY output from another adder integrated circuit. The carry signal CARRY may be a carry bit of a binary sum result of the adder integrated circuit, and may be referred to as a carry digit. For example, when a bit '1' and a bit '1' are summed, '1' of binary '10' may be output as a carry signal CARRY, and '0' of binary '10' may be output as a sum signal SUM.

The first logic gate group 10 may output a first internal signal SIG_A and a second internal signal SIG_B by receiving the first input signal INPUT_A and the second input signal INPUT_B. The first internal signal SIG_A and the second internal signal SIG_B may be signals generated by performing a logic operation on the first input signal INPUT_A and the second input signal INPUT_B through at least one logic gate in the first logic gate group 10.

The second logic gate group 20 and the third logic gate group 30 may each receive at least one of the first internal signal SIG_A and the second internal signal SIG_B each generated by the first logic gate group 10. In addition, the second logic gate group 20 and the third logic gate group 30 may respectively generate the sum signal SUM and the carry signal CARRY by performing a logic operation on at least one of the first internal signal SIG_A, the second internal signal SIG_B, and the third input signal INPUT_C. For example, the second logic gate group 20 may output the sum signal SUM based on the second internal signal SIG_B and the third input signal INPUT_C, and the third logic gate group 30 may output the carry signal CARRY based on the first internal signal SIG_A, the second internal signal SIG_B, and the third input signal INPUT_C. That is, the second logic gate group 20 and the third logic gate group 30 receive only the third input signal INPUT_C from the outside, and may respectively generate the sum signal SUM and the carry signal CARRY by using a signal generated inside the adder integrated circuit. Accordingly, the number of input pins for receiving an input signal from the outside in transistors constituting the second logic gate group 20 and the third logic gate group 30 may be reduced. Thus, the adder integrated circuit according to an embodiment of the inventive concept may perform computations faster and reduce power consumption.

Figure 2:
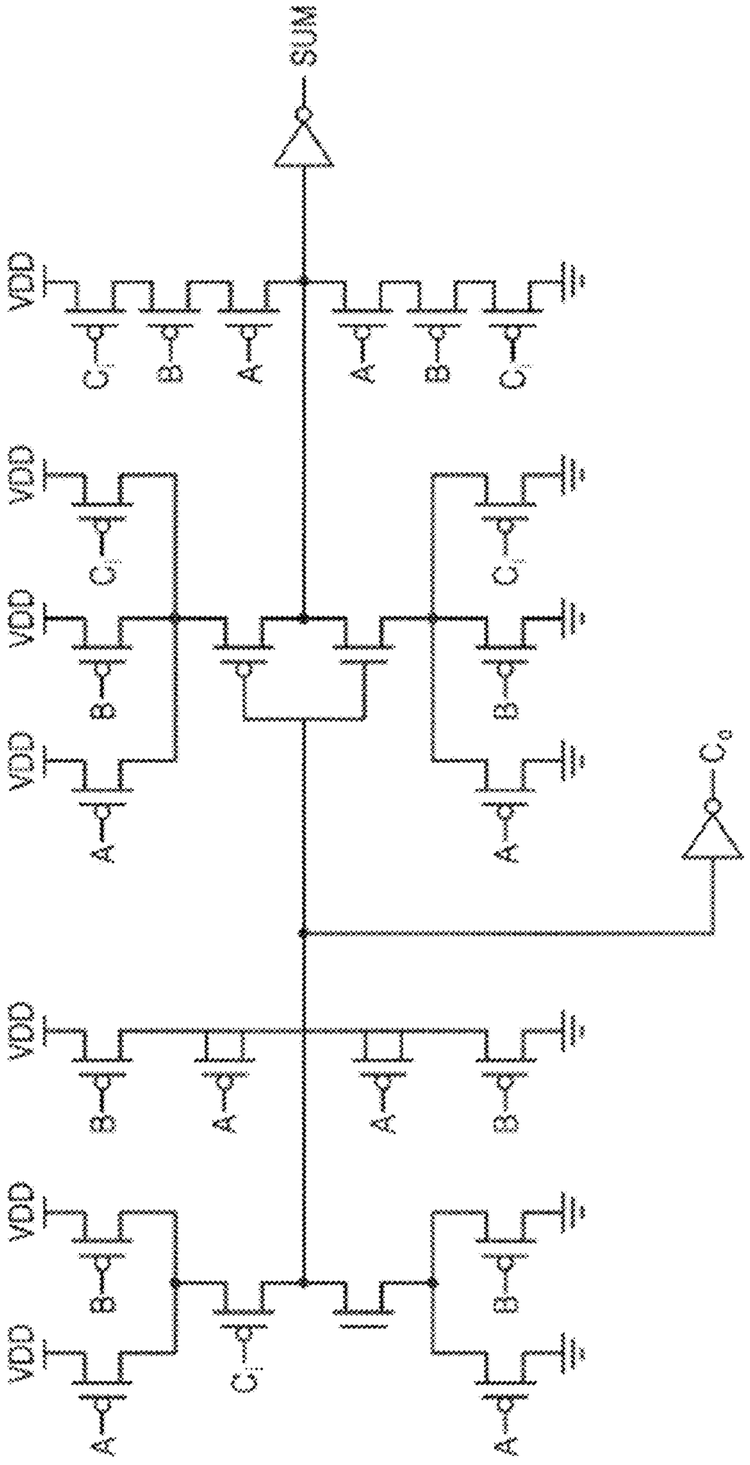
FIG. 2 (Prior Art)
FIG. 2 is a circuit diagram illustrating an adder integrated circuit according to a comparative embodiment.

FIG. 2 is a circuit diagram illustrating an adder integrated circuit according to a comparative embodiment.

Referring to FIG. 2, the adder integrated circuit according to the comparative embodiment may output a carry signal $C_0$ and a sum signal SUM by using a logic gate including a plurality of transistors. The adder integrated circuit may output the sum signal SUM by performing an exclusive OR operation on three input signals (e.g., A, B, Ci), and may output the carry signal $C_0$ by performing an AND-OR operation.

The adder integrated circuit of FIG. 2 may include a combination of transistors, in which a distance from an input terminal to an output terminal, from which the carry signal C0 is output, corresponds to 2 gates and a distance from the input terminal to an output terminal, from which the sum signal SUM is output, corresponds to 3 gates. In addition, because the adder integrated circuit of FIG. 2 has a small number of transistors compared to an operation that is actually performed, the adder integrated circuit may be easily integrated. However, the adder integrated circuit according to the comparative embodiment may have a structure, in which connection with input signal lines is complicated, because the proportion of transistors that receive an external input signal as a gate signal from among all transistors is high. Due to input pin capacitance, the actual operation speed of the adder integrated circuit according to the comparative embodiment may be slower than that of an ideal adder integrated circuit. Therefore, the adder integrated circuit according to the comparative embodiment may not be suitable for a processor such as a neural processing unit (NPU) or graphics processing unit (GPU) that is complex and requires high performance.

Figure 3:
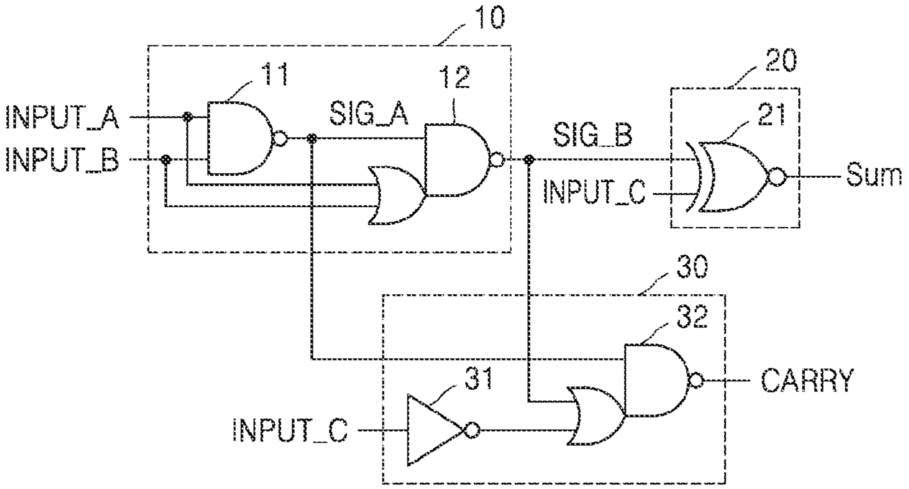
FIG. 3 is a circuit diagram illustrating logic gates in each of the logic gate groups according to the embodiment of FIG. 2.

FIG. 3 is a circuit diagram illustrating logic gates in each of the logic gate groups according to the embodiment of FIG. 1.

Referring to FIG. 3, the first logic gate group 10 may include a first NAND gate 11 and a first OR-AND-Inverter (OAI) gate 12. The first NAND gate 11 may perform a NAND operation on the first input signal INPUT_A and the second input signal INPUT_B to generate a first internal signal SIG_A. The first OAI gate 12 may perform an XNOR operation on the first input signal INPUT_A and the second input signal INPUT_B based on the first internal signal SIG_A, the first input signal INPUT_A, and the second input signal INPUT_B. The first OAI gate 12 may include a combination of an OR gate and a NAND gate. The OR gate may perform an OR operation on the first input signal INPUT_A and the second input signal INPUT_B. The NAND gate may perform a NAND operation on a result of the OR operation and the first internal signal SIG_A. The first OAI gate 12 may output the second internal signal SIG_B as a result of performing a logic operation.

The second logic gate group 20 may receive the second internal signal SIG_B from the first logic gate group 10 and the third input signal INPUT_C from the outside. Thus, the second logic gate group 20 may generate the sum signal SUM without directly receiving the first input signal INPUT_A and the second input signal INPUT_B from the outside. For example, the sum signal SUM may be a signal including one bit, and may be a signal having a logic state corresponding to the least significant bit (LSB) of a result of summing the first to third input signals INPUT_A to INPUT_C. The second logic gate group 20 may output the sum signal SUM by performing an XNOR operation on the second internal signal SIG_B and the third input signal INPUT_C. In an embodiment, the second logic gate group 20 may include an XNOR gate 21 to perform the XNOR operation. There may be several combinations of transistors capable of performing the XNOR operation, and one of the several combinations may be selected according to the performance required by the adder integrated circuit. Embodiments of the several combinations will be described in detail later with reference to FIGS. 7 to 11.

The third logic gate group 30 may receive the first internal signal SIG_A and the second internal signal SIG_B from the first logic gate group 10 and the third input signal INPUT_C from the outside. Thus, the third logic gate group may generate the carry signal CARRY without directly receiving the first input signal INPUT_A and the second input signal INPUT_B. The carry signal CARRY may be a signal including one bit, and may be a signal having a logic state corresponding to the most significant bit (MSB) of the result of summing the first to third input signals INPUT_A to INPUT_C. The third logic gate group 30 may include an inverter 31 and a second OAI gate 32. The second OAI gate 32 may generate the carry signal CARRY based on the first internal signal SIG_A, the second internal signal SIG_B, and an inverted signal of the third input signal INPUT_C, which is generated by the inverter 31. For example, the third logic gate group 30 may generate the carry signal CARRY by performing a NAND operation on the first internal signal SIG_B and a result of an OR operation performed on the inverted signal of the third input signal INPUT_C and the second internal signal SIG_B.

In the adder integrated circuit according to an embodiment of the inventive concept, only the first logic gate group 10 receives the first input signal INPUT_A and the second input signal INPUT_B and each of the second logic gate group 20 and the third logic gate group 30 receives only the third input signal INPUT_C from the outside. Thus, the complexity of an input line connected to the adder integrated circuit may be reduced. Accordingly, the adder integrated circuit according to an embodiment of the inventive concept may have a lower input pin capacitance compared to the comparative embodiment. Thus the adder integrated circuit may be suitable for a processor that is complex and requires high performance. In addition, in the adder integrated circuit according to an embodiment of the inventive concept, because the number of input lines is reduced, power consumption may be reduced, and routing resources may be further reduced.

FIG. 4 is a table showing a first internal signal SIG_A, a second internal signal SIG_B, a carry signal CARRY, and a sum signal SUM, which are output according to logic states of the first input signal INPUT_A to the third input signal INPUT_C input to the adder integrated circuit according to the embodiment of the inventive concept.

Referring to FIGS. 3 and 4, the adder integrated circuit may generate the first internal signal SIG_A and the second internal signal SIG_B based on the first input signal INPUT_A and the second input signal INPUT_B. The first logic gate group 10 may perform a NAND operation on the first input signal INPUT_A and the second input signal INPUT_B to generate a first internal signal SIG_A for the logic state of FIG. 4. The first OAI gate 12 of the first logic gate group 10 may perform a logic operation on the first input signal INPUT_A, the second input signal INPUT_B, and the first internal signal SIG_A. Thus the first OAI gate 12 may generate the second internal signal SIG_B as a result of performing an XNOR operation on the first input signal INPUT_A and the second input signal INPUT_B. The XNOR operation may be referred to as a comparison operation that outputs '1' when the logic states of two input signals are the same and outputs '0' when the logic states are different.

The second logic gate group 20 may perform an XNOR operation on the third input signal INPUT_C and the second internal signal SIG_B. Thus, the second logic gate group 20 may output '1' as the sum signal SUM when the third input signal INPUT_C and the second internal signal SIG_B have the same logic state. The second OAI gate 32 of the third logic gate group 30 may be configured to perform the same function as the first OAI gate 12, and may output the carry signal CARRY based on the inverted signal of the third input signal INPUT_C, the first internal signal SIG_A, and the second internal signal SIG_B.

For example, when the first input signal INPUT_A is '1' and the second input signal INPUT_B is '0', the first NAND gate 11 of the first logic gate group 10 may output '1', which is a result of a NAND operation on '1' and '0', as the first internal signal SIG_A. When the first OAI gate 12 of the first logic gate group 10 may receive '1' as the first input signal INPUT_A, '0' as the second input signal INPUT_B, and '1' as the first internal signal SIG_A, the first OAI gate 12 may generate '1' as a result of an OR operation on the first input signal INPUT_A and the second input signal INPUT_B. The first OAI gate 12 may output '0' as the second internal signal SIG_B by performing a NAND operation on the OR operation result of '1' and the first internal signal SIG_A of '1'.

The second logic gate group 20 may output the sum signal SUM of '1' when the second internal signal SIG_B is the same as the third input signal INPUT_C. Therefore, when the first logic gate group 10 outputs '0' as the second internal signal SIG_B, the second logic gate group 20 outputs '0' as the sum signal SUM when receiving '1' as the third input signal INPUT_C and outputs '1' as the sum signal SUM when receiving '0' as the third input signal INPUT_C. The second OAI gate 32 of the third logic gate group 30 may receive a first internal signal SIG_A of '1' and a second internal signal SIG_B of '0'. When the third logic gate group 30 receives '0' as the third input signal INPUT_C, the third logic gate group 30 may output '1' as a result of an OR operation on the inverted signal of the third input signal INPUT_C and the second internal signal SIG_B, and may output '0' as the carry signal CARRY as a result of performing a NAND operation on the OR operation result of '1' and the first internal signal SIG_A of '1'. When the third logic gate group 30 receives '1' as the third input signal INPUT_C, the third logic gate group 30 may output '0' as the result of performing the OR operation on the inverted signal of the third input signal INPUT_C and the second internal signal SIG_B, and may output '1' as the carry signal CARRY as the result of performing the NAND operation on the OR operation result of '0' and the first internal signal SIG_A of '1'.

Figure 5:
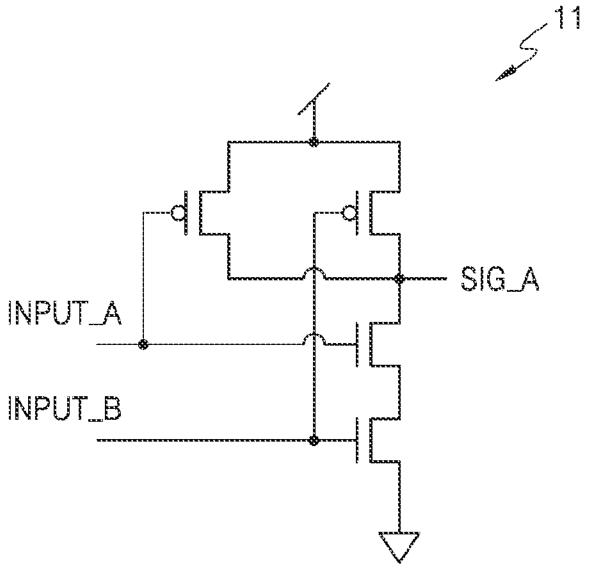
FIG. 5 is a circuit diagram illustrating a first negative AND (NAND) gate according to an embodiment of the inventive concept.

FIG. 5 is a circuit diagram illustrating a first NAND gate 11 of FIG. 3 according to an embodiment of the inventive concept.

Referring to FIG. 5, the first NAND gate 11 according to an embodiment may include a combination of four transistors. Two transistors may be arranged in parallel between an output node, from which the first internal signal SIG_A is output, and a power node receiving power (e.g., a first voltage). The two transistors arranged in parallel may be P-channel metal oxide semiconductor (PMOS) transistors that respectively receive the first input signal INPUT_A and the second input signal INPUT_B as gate signals. Accordingly, when one of the first input signal INPUT_A and the second input signal INPUT_B is '0', a first internal signal SIG_A of '1' may be generated. N-channel metal oxide semiconductor (NMOS) transistors respectively receiving the first input signal INPUT_A and the second input signal INPUT_B as gate signals may be connected in series between the output node and a ground node receiving a ground voltage (e.g., a second voltage less than the first voltage). Thus, when both of the first input signal INPUT_A and the second input signal INPUT_B are '1', a first internal signal SIG_A of '0' may be generated.

Figure 6:
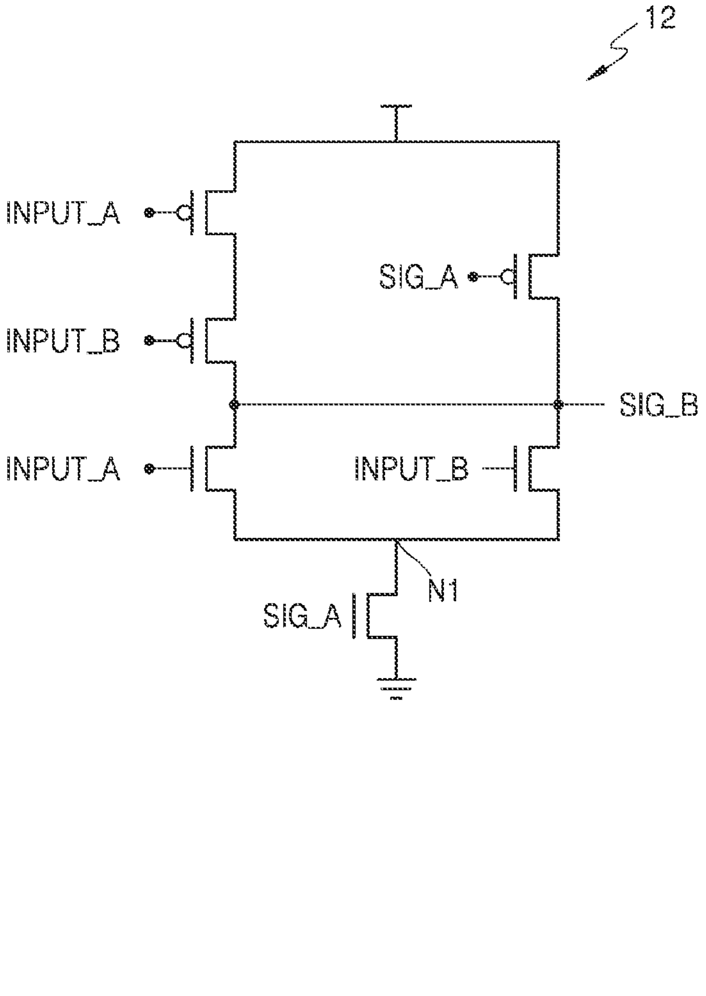
FIG. 6 is a circuit diagram illustrating a first OR-AND-Inverter (OAI) gate according to an embodiment of the inventive concept.

FIG. 6 is a circuit diagram illustrating a first OAI gate 12 of FIG. 3 according to an embodiment of the inventive concept.

Referring to FIG. 6, the first OAI gate 12 according to an embodiment may include a combination of six transistors. PMOS transistors respectively receiving the first input signal INPUT_A and the second input signal INPUT_B as gate signals may be connected in series between an output node, from which the second internal signal SIG_B is output, and a power node. A PMOS transistor receiving the first internal signal SIG_A as a gate signal may be connected in parallel to the PMOS transistors. Accordingly, the first OAI gate 12 may output '1' as the second internal signal SIG_B when both the first input signal INPUT_A and the second input signal INPUT_B are '0' and the first internal signal SIG_A is '0'. NMOS transistors respectively receiving the first input signal INPUT_A and the second input signal INPUT_B as gate signals may be connected in parallel between the output node, from which the second internal signal SIG_B is output. A first node N1 and an NMOS transistor receiving the first internal signal SIG_A may be connected between the first node N1 and a ground node. Accordingly, the first OAI gate 12 may output '0' as the second internal signal SIG_B when the first internal signal SIG_A is '1' and at least one of the first input signal INPUT_A and the second input signal INPUT_B is '1'. The embodiment of FIG. 6 exemplarily shows a circuit diagram of the first OAI gate 12. However, the adder integrated circuit according to the embodiment of the inventive concept is not limited thereto, and the second OAI gate 32 in the third logic gate group 30 may also be configured as the circuit diagram of FIG. 6. In addition, referring to FIG. 6, although two NMOS transistors respectively receiving the first input signal INPUT_A and the second input signal INPUT_B are connected in parallel between the first node N1 and the output node, the inventive concept is not limited thereto. For example, an NMOS transistor receiving the first internal signal SIG_A may be arranged between the first node N1 and the output node, and two NMOS transistors respectively receiving the first input signal INPUT_A and the second input signal INPUT_B may be connected in parallel between the first node N1 and the ground node.

FIGS. 7 to 11 are circuit diagrams illustrating the XNOR gate 21 of FIG. 3 according to embodiments of the inventive concept.

FIGS. 7 to 11 may be embodiments of different transistor combinations of a logic gate that performs an XNOR operation. For example, FIGS. 7 and 8 may each be an embodiment of a transistor combination including a pass gate, FIG. 9 may be an embodiment of a transistor combination in which a plurality of transistor groups are connected between an output node and a ground node or between an output node and a power node, and FIGS. 10 and 11 may each be an embodiment of a combination in which transistors are connected to have a multiplexer (MUX) structure.

Figure 7:
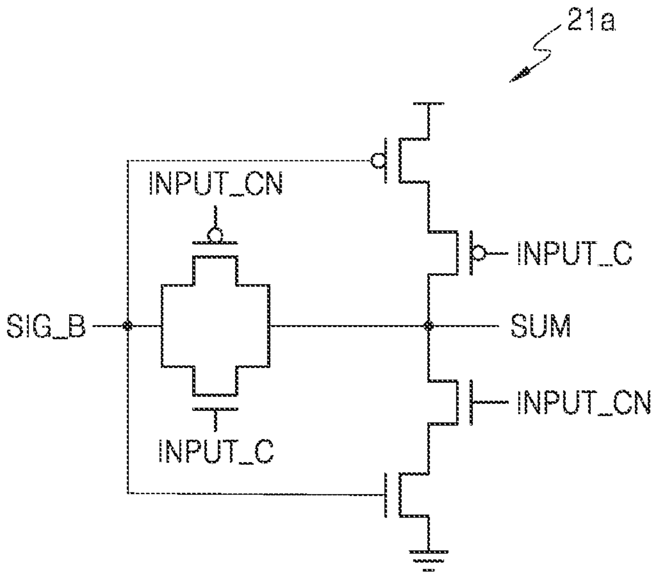
FIGS. 7 to 11 are circuit diagrams illustrating exclusive negative OR (XNOR) gates according to embodiments of the inventive concept.

Referring to FIG. 7, a pass gate may be connected between an input node receiving the second internal signal SIG_B and an output node outputting the sum signal SUM. The pass gate is a transistor that activates a connection between a source and a drain of a transistor when an input signal in a certain logic state is applied thereto, and may be referred to as a transmission gate. The pass gate in FIG. 7 may receive the third input signal INPUT_C and an inverted signal INPUT_CN of the third input signal INPUT_C as gate signals, and may activate a connection between the input node and the output node according to a logic state of the third input signal INPUT_C. For example, when the logic level of the third input signal INPUT_C is high, the connection between the input node and the output node may be activated. Thus, when the third input signal INPUT_C is '1' and the second internal signal SIG_B is '0', the sum signal SUM may be '0', and when the third input signal INPUT_C is '1' and the second internal signal SIG_B is '1', the sum signal SUM may be '1'.

In addition, two PMOS transistors respectively receiving the second internal signal SIG_B and the third input signal INPUT_C as gate signals may be connected in series between the output node and the power node. Two NMOS transistors respectively receiving the inverted signal INPUT_CN of the third input signal INPUT_C and the second internal signal SIG_B as gate signals may be connected in series between the output node and the ground node. Accordingly, when the second internal signal SIG_B is '0' and the third input signal INPUT_C is '0', an XNOR gate 21*a* of FIG. 7 may output the sum signal SUM of '1'. In addition, when the second internal signal SIG_B is '1' and the third input signal INPUT_C is '0', the XNOR gate 21*a* may output the sum signal SUM of '0'.

Figure 8:
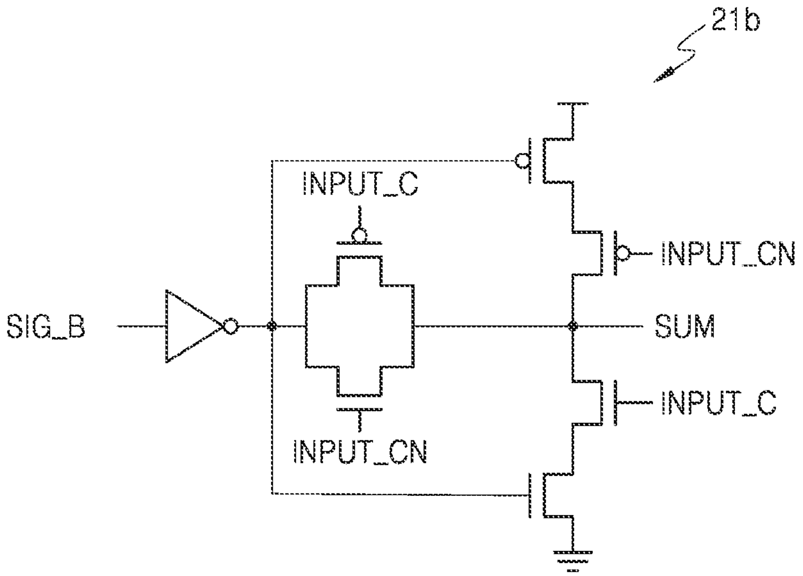

Referring to FIG. 8, an XNOR gate 21*b* according to an embodiment may activate a connection between an input node and an output node in response to receiving a third input signal INPUT_C in a logic state different from that of the embodiment of FIG. 7. The XNOR gate 21*b* may be used to implement the XNOR gate 21 of FIG. 3. For example, when the third input signal INPUT_C having a logic low level is input to a pass gate in the XNOR gate 21*b*, a connection between the input node and the output node may be activated, and a logic level of an inverted signal of the second internal signal SIG_B may be a logic level of the sum signal SUM. The XNOR gate 21*b* may include an inverter to generate the inverted signal. When the third input signal INPUT_C is '0', the pass gate may be activated. In this case, when the second internal signal SIG_B is '0', the sum signal SUM may be '1', and when the second internal signal SIG_B is '1', the sum signal SUM may be '0'.

In addition, two PMOS transistors respectively receiving the inverted signal of the second internal signal SIG_B and an inverted signal INPUT_CN of the third input signal INPUT_C as gate signals may be connected in series between the output node and a power node. Two NMOS transistors respectively receiving the third input signal INPUT_C and the inverted signal of the second internal signal SIG_B as gate signals may be connected in series between the output node and a ground node. Accordingly, when the second internal signal SIG_B is '1' and the third input signal INPUT_C is '1', the XNOR gate 21*b* may output the sum signal SUM of '1'. In addition, when the second internal signal SIG_B is '0' and the third input signal INPUT_C is '1', the XNOR gate 21*b* may output the sum signal SUM of '0'.

Figure 9:
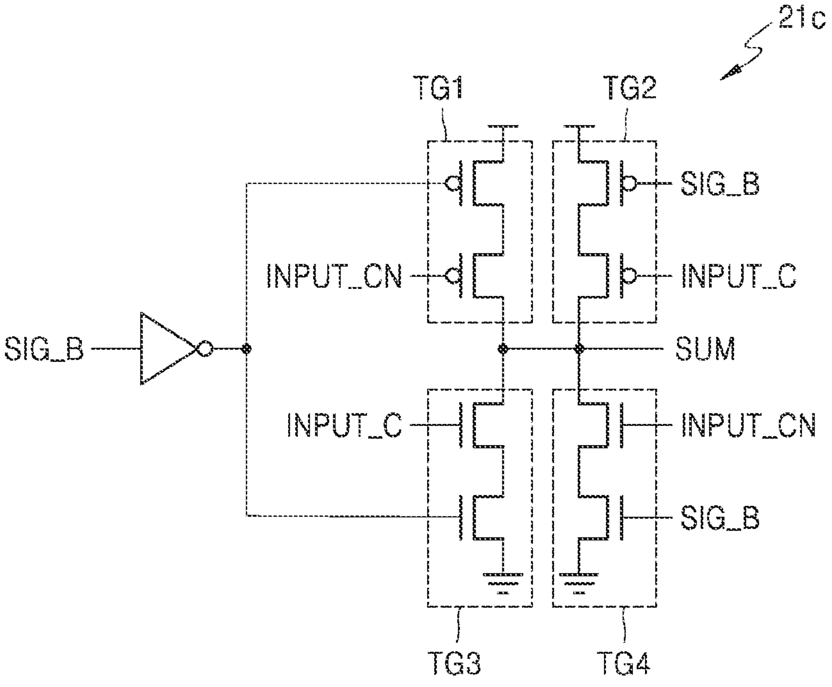

Referring to FIG. 9, an XNOR gate 21*c* according to an embodiment may comprise a plurality of transistor groups. The XNOR gate 21*c* may be used to implement the XNOR gate 21 of FIG. 3. The plurality of transistor groups may be arranged between an output node and a power node or between an output node and a ground node. Each of the transistor groups may include two transistors, and the transistors may receive signals related to the second internal signal SIG_B and the third input signal INPUT_C. For example, among the plurality of transistor groups, a first transistor group TG1 may be arranged between the output node and the power node, and two PMOS transistors in the first transistor group TG1 may be connected in series. One of the two PMOS transistors may receive an inverted signal of the second internal signal SIG_B as a gate signal, and the other PMOS transistor may receive an inverted signal INPUT_CN of the third input signal INPUT_C as a gate signal. The XNOR gate 21*c* may include an inverter to generate the inverted signal of the second internal signal SIG_B. Accordingly, when the second internal signal SIG_B is '1' and the third input signal INPUT_C is '1', a connection between the power node and the output node may be activated by the first transistor group TG1, and the second logic gate group 20 may output the sum signal SUM of '1' through the output node. A second transistor group TG2 may be arranged between the output node and the power node, and two PMOS transistors in the second transistor group TG2 may be connected in series. Because the two PMOS transistors respectively receive the second internal signal SIG_B and the third input signal INPUT_C as gate signals, the second logic gate group 20 may output the sum signal SUM of '1' through the output node when the second internal signal SIG_B is '0' and the third input signal INPUT_C is '0'.

A third transistor group TG3 and a fourth transistor group TG4 may be connected in parallel between the ground node and the output node, and transistors in each of the third transistor group TG3 and the fourth transistor group TG4 may be serially connected. Two NMOS transistors in the third transistor group TG3 may respectively receive the third input signal INPUT_C and the inverted signal of the second internal signal SIG_B as gate signals. Two NMOS transistors in the fourth transistor group TG4 may respectively receive the inverted signal INPUT_CN of the third input signal INPUT_C and the second internal signal SIG_B as gate signals. Accordingly, when the third input signal INPUT_C is '0' and the second internal signal SIG_B is '1', and when the third input signal INPUT_C is '1' and the second internal signal SIG_B is '0', the second logic gate group 20 may output the sum signal SUM of '0' through the output node.

Figure 10:
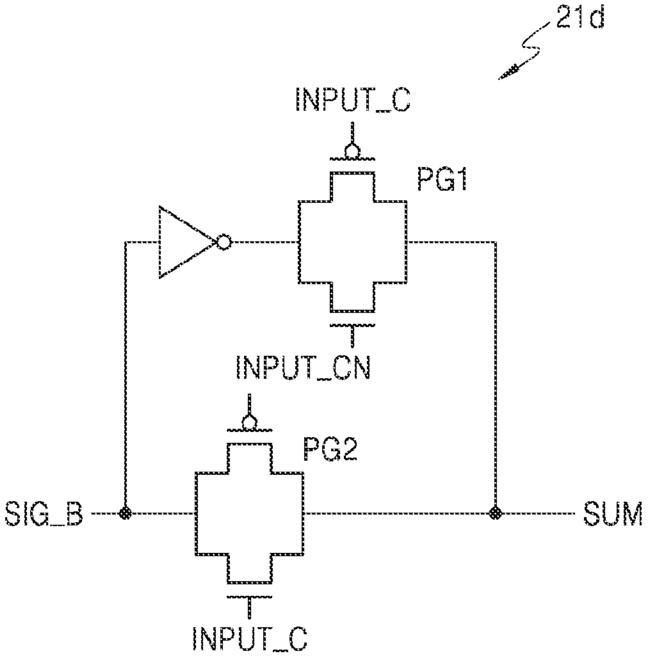

Referring to FIG. 10, an XNOR gate 21*d* according to an embodiment may use the third input signal INPUT_C as a selection signal, and may output one of the second internal signal SIG_B and an inverted signal of the second internal signal SIG_B as the sum signal SUM according to a logic level of the third input signal INPUT_C. The XNOR gate 21*d* may be used to implement the XNOR gate 21 of FIG. 3. The XNOR gate 21*d* may include an inverter to generate the inverted signal of the second internal signal SIG_B. Specifically, two pass gates may be arranged between an input node and an output node, and the two pass gates may operate mutually and exclusively. For example, when the third input signal INPUT_C of '1' is received, only a second pass gate PG2 receiving the second internal signal SIG_B from among the two pass gates may be activated, and thus, a signal having the same logic level as the second internal signal SIG_B may be output as the sum signal SUM. Conversely, when the third input signal INPUT_C of '0' is received, only a first pass gate PG1 receiving the inverted signal of the second internal signal SIG_B may be activated, and thus, a signal having a logic level opposite to that of the second internal signal SIG_B may be output as the sum signal SUM. That is, the XNOR gate 21*d* according to the embodiment may use the third input signal INPUT_C as a selection signal, and may perform the same operation as a multiplexer (MUX) circuit that outputs one of the second internal signal SIG_B and the inverted signal of the second internal signal SIG_B.

Figure 11:
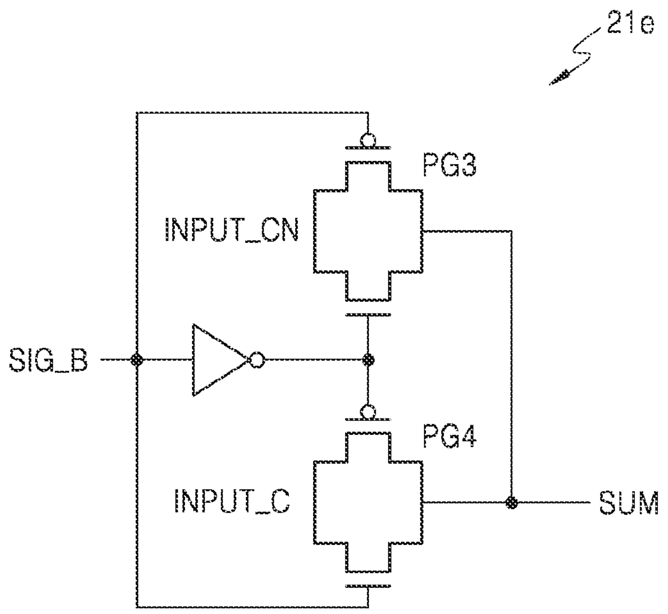

Referring to FIG. 11, an XNOR gate 21*e* according to an embodiment may use an inverted signal of the second internal signal SIG_B as a selection signal, and may output one of the third signal INPUT_C and an inverted signal INPUT_CN of the third input signal as the sum signal SUM according to a logic level of the second internal signal SIG_B. The XNOR gate 21*e* may be used to implement the XNOR gate 21 of FIG. 3. The XNOR gate 21*e* may include an inverter to generate the inverted signal of the second internal signal SIG_B. Specifically, two pass gates may be arranged between an input node and an output node, and the two pass gates may operate mutually and exclusively. For example, when the second internal signal SIG_B of '1' is received, only a fourth pass gate PG4 receiving the third input signal INPUT_C from among the two pass gates may be activated, and thus, a signal having the same logic level as the third input signal INPUT_C may be output as the sum signal SUM. Conversely, when the second internal signal SIG_B of '0' is received, only a third pass gate PG3 receiving the inverted signal INPUT_CN of the third input signal INPUT_C may be activated, and thus, a signal having a logic level opposite to that of the third input signal INPUT_C may be output as the sum signal SUM. That is, the XNOR gate 21*e* according to the embodiment may use the second internal signal SIG_B as a selection signal, and may perform the same operation as a MUX circuit that outputs one of the third input signal INPUT_C and the inverted signal INPUT_CN of the third input signal INPUT_C.

Embodiments including a pass gate from among the XNOR gates 21*a* to 21*e* according to embodiments of the inventive concept may reduce the number of transistors, thereby being useful for integration. In addition, an embodiment including a MUX circuit from among the XNOR gates 21*a* to 21*e* may have a higher number of transistors than other embodiments, but may have a faster operation speed.

Figure 12:
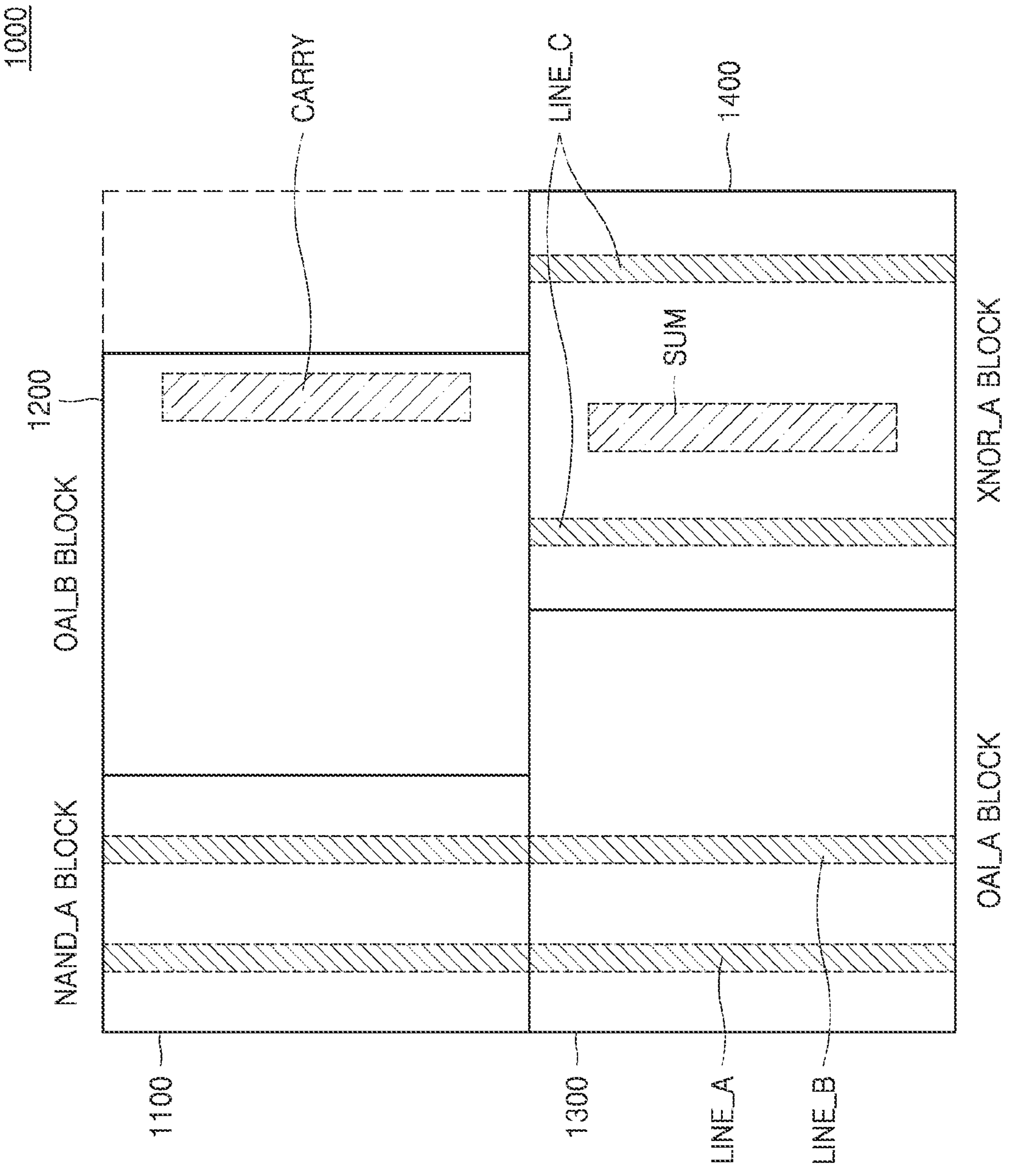
FIG. 12 is a diagram illustrating a layout of an adder integrated circuit according to an embodiment of the inventive concept.

FIG. 12 is a diagram illustrating a layout of an adder integrated circuit 1000 according to an embodiment of the inventive concept.

Referring to FIG. 12, the adder integrated circuit 1000 according to the embodiment may include a plurality of logic gate blocks, and block groups including logic gate blocks may be stacked in different layers. For example, the adder integrated circuit 1000 may include a NAND block 1100 (e.g., a first sub-region for housing one or more NAND circuits for performing one or more NAND operations), a first OAI block 1300 (e.g., a second sub-region for housing one or more OAI logic circuits for performing OAI operations), a second OAI block 1200 (e.g., a third sub-region housing one or more OAI logic circuits for performing OAI operations), and an XNOR block 1400 (e.g., a fourth sub-region housing one or more XNOR logic circuits for performing XNOR operations). A first block group including the NAND block 1100 and the first OAI block 1300 and a second block group including the second OAI block 1200 and the XNOR block 1400 may be stacked in different layers. A combination of logic gate blocks constituting the first block group and the second block group is not limited to the embodiment of FIG. 12, and may include a combination of logic gate blocks capable of outputting a carry signal CARRY and a sum signal SUM by transmitting and receiving internal signals.

Referring to FIGS. 3 and 12, a circuit of the first logic gate group 10 may include the NAND block 1100 (e.g., NAND_A) and the first OAI block 1300 (e.g., OAI_A), a circuit of the second logic gate group 20 may include the XNOR block 1400 (e.g., XNOR_A), and a circuit of the third logic gate group 30 may include the second OAI block 1200 (e.g., OAI_B). The NAND block 1100 and the first OAI block 1300 may share a first input line LINE_A receiving a first input signal INPUT_A and a second input line LINE_B receiving a second input signal INPUT_B. The XNOR block 1400 may receive a third input signal INPUT_C through a third input line LINE_C.

The NAND block 1100 may generate a first internal signal SIG_A based on the first input signal INPUT_A and the second input signal INPUT_B and provide the first internal signal SIG_A to the first OAI block 1300 and the second OAI block 1200. The first OAI block 1300 may generate a second internal signal SIG_B based on the first input signal INPUT_A, the second input signal INPUT_B, and the first internal signal SIG_A and provide the second internal signal SIG_B to the second OAI block 1200 and the XNOR block 1400. According to an embodiment, the XNOR block 1400 may receive a third input signal INPUT_C through two third input lines LINE_C, and may generate an inverted signal INPUT_CN of the third input signal INPUT_C by inverting the third input signal INPUT_C received through one third input line LINE_C. The inverted signal INPUT_CN of the third input signal INPUT_C may be provided to the second OAI block 1200 through an internal line of an integrated circuit.

The XNOR block 1400 may generate a sum signal SUM based on at least some of the third input signal INPUT_C, the inverted signal INPUT_CN of the third input signal INPUT_C, the second internal signal SIG_B, and an inverted signal of the second internal signal SIG_B, as described above through the embodiments of FIGS. 7 to 11. The XNOR block 1400 may output the sum signal SUM to the outside. The second OAI block 1200 may receive the inverted signal INPUT_CN of the third input signal INPUT_C through the XNOR block 1400, receive the first internal signal SIG_A through the NAND block 1100, and receive the second internal signal SIG_B through the first OAI block 1300. The second OAI block 1200 may generate a carry signal CARRY based on the inverted signal INPUT_CN of the third input signal INPUT_C, the first internal signal SIG_A, and the second internal signal SIG_B.

Figure 13:
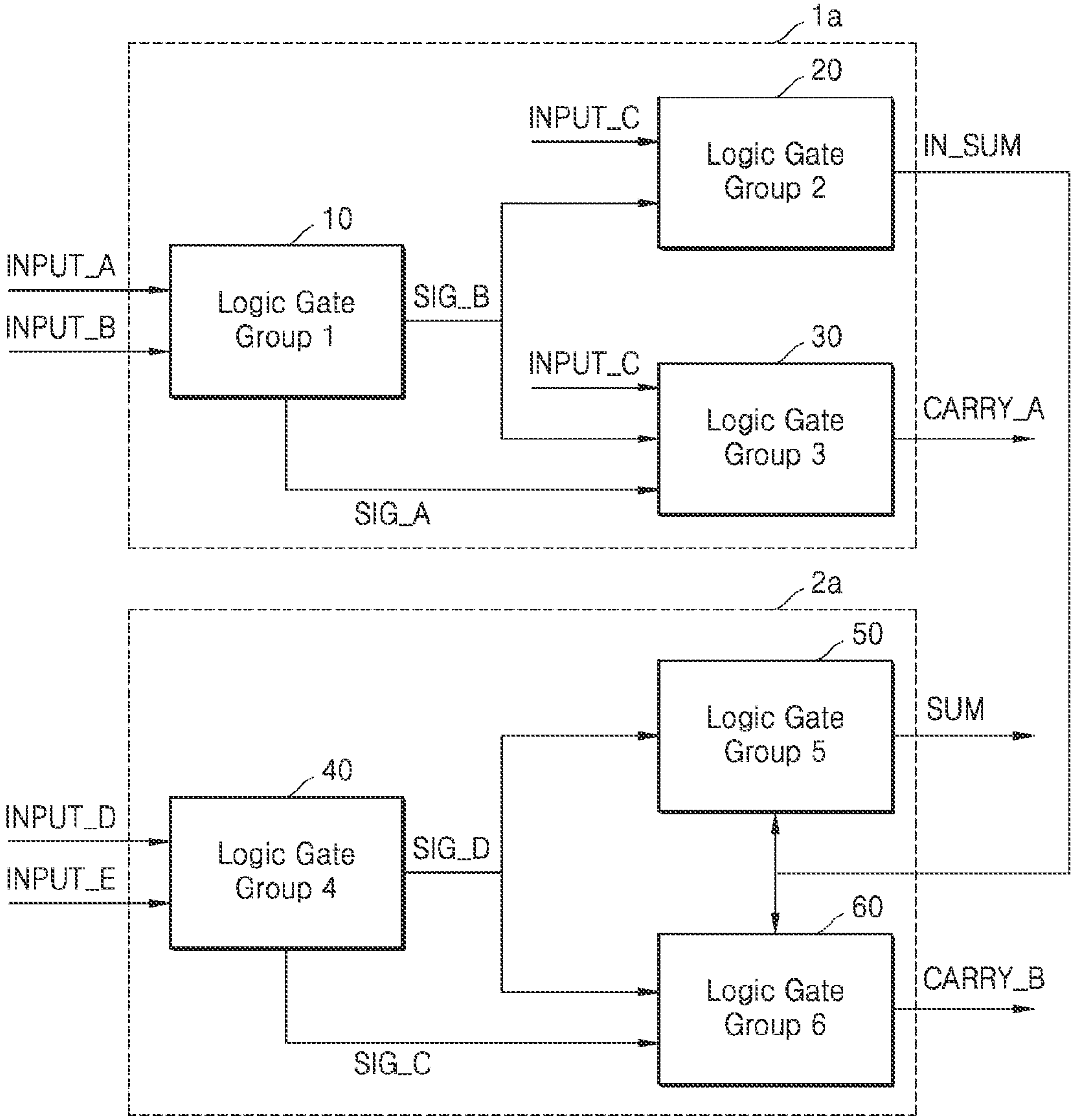
FIG. 13 is a block diagram illustrating logic gate groups of a 4-2 compressor integrated circuit according to an embodiment of the inventive concept.
Figure 14:
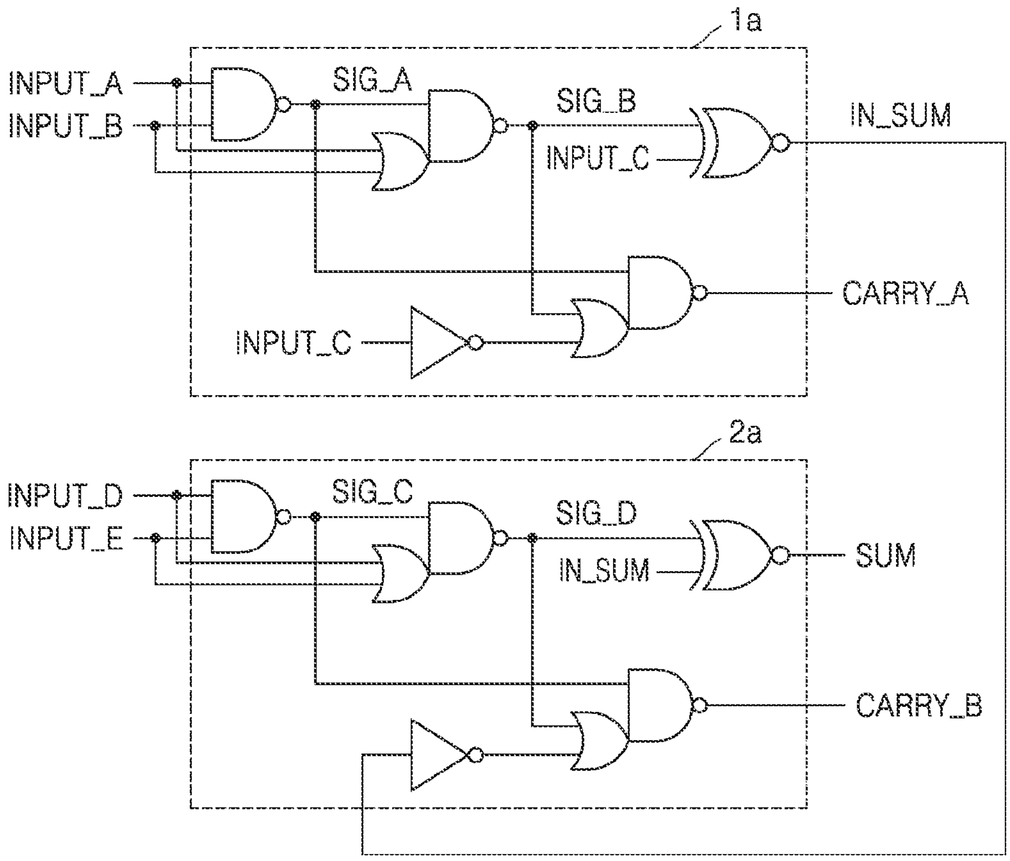
FIG. 14 is a block diagram illustrating logic gates in each of the logic gate groups according to the embodiment of FIG. 13.

FIG. 13 is a block diagram illustrating logic gate groups of a 4-2 compressor integrated circuit according to an embodiment of the inventive concept, and FIG. 14 is a block diagram illustrating logic gates in each of the logic gate groups according to the embodiment of FIG. 13.

Referring to FIG. 13, the 4-2 compressor integrated circuit according to an embodiment of the inventive concept may include a first adder 1*a* and a second adder 2*a*. Each of the first and second adders 1*a* and 2*a* may include three logic gate groups. The 4-2 compressor integrated circuit may receive an internal sum signal IN_SUM, which is output as a sum signal of the first adder 1*a*, as an input signal by the second adder 2*a*, and may output a first carry signal CARRY_A, a second carry signal CARRY_B, and a sum signal SUM by performing a sum operation on five input signals. The internal sum signal IN_SUM is a bit corresponding to the LSB of a sum result of the first adder 1*a*, and may be an intermediate generation bit of a sum operation for the first input signal INPUT_A to the third input signal INPUT_C. The second adder 2*a* may receive the internal sum signal IN_SUM as an input signal in order to continuously perform a sum operation of the first adder 1*a*. Any one of the five input signals input to the 4-2 compressor integrated circuit according to an embodiment of the inventive concept may be a carry signal generated by another adder or 4-2 compressor integrated circuit. The first carry signal CARRY_A and the second carry signal CARRY_B may be carry bits of a binary sum result. In this case, when four or more of the five input signals are '1', a carry has to be performed twice. The 4-2 compressor integrated circuit may output '1' for both the first carry signal CARRY_A and the second carry signal CARRY_B, and thus, a carry may occur in another adder or 4-2 compressor integrated circuit leading to the rear stage.

The second adder 2*a* may include a fourth logic gate group 40 like the first logic gate group 10, a fifth logic gate group 50 like the second logic gate group 20, and a sixth logic gate group 60 like the third logic gate group 30. The fourth logic gate group 40 may perform on operation on a fourth input signal INPUT_D and a fifth input signal INPUT_E to generate that is like the operation performed by the first logic gate group 10 to generate a third internal signal SIG_C and a fourth internal signal SIG_D. The fifth logic gate group 50 may perform an operation the fourth internal signal SIG_D and the internal sum signal IN_SUM like the operation performed by the second logic gate group 20 to generate the sum signal SUM. The sixth logic gate group 60 may perform an operation the third internal signal SIG_C, the fourth internal signal SIG_D, and the internal sum signal IN_SUM, like the operation performed by the third logic gate group 30 to generate the carry signal CARRY_B.

According to an embodiment, each of the first and second adders 1*a* and 2*a* may include a combination of the logic gates described above with reference to FIGS. 1 and 3, and the second adder 2*a* may receive the internal sum signal IN_SUM of the first adder 1*a* as an input signal. Accordingly, the 4-2 compressor integrated circuit may output a result of summing the first to fifth input signals INPUT_A to INPUT_E in a structure in which the first adder 1$a$ and the second adder 2$a$ are connected in a cascade.

Referring to FIG. 14, the 4-2 compressor integrated circuit according to an embodiment of the inventive concept may have a structure in which two adder integrated circuits described above with reference to FIG. 3 are continuously connected, and an internal sum signal IN_SUM generated by the first adder 1$a$ may be input as one of the input signals of the second adder 2$a$. The first adder 1$a$ and the second adder 2$a$ may include the same logic gate, but may include different combinations of transistors, which perform the same function. For example, an XNOR gate in the first adder 1$a$ and an XNOR gate in the second adder 2$a$ may include different transistor combinations of different embodiments among the embodiments of FIGS. 7 to 11.

Figure 15:
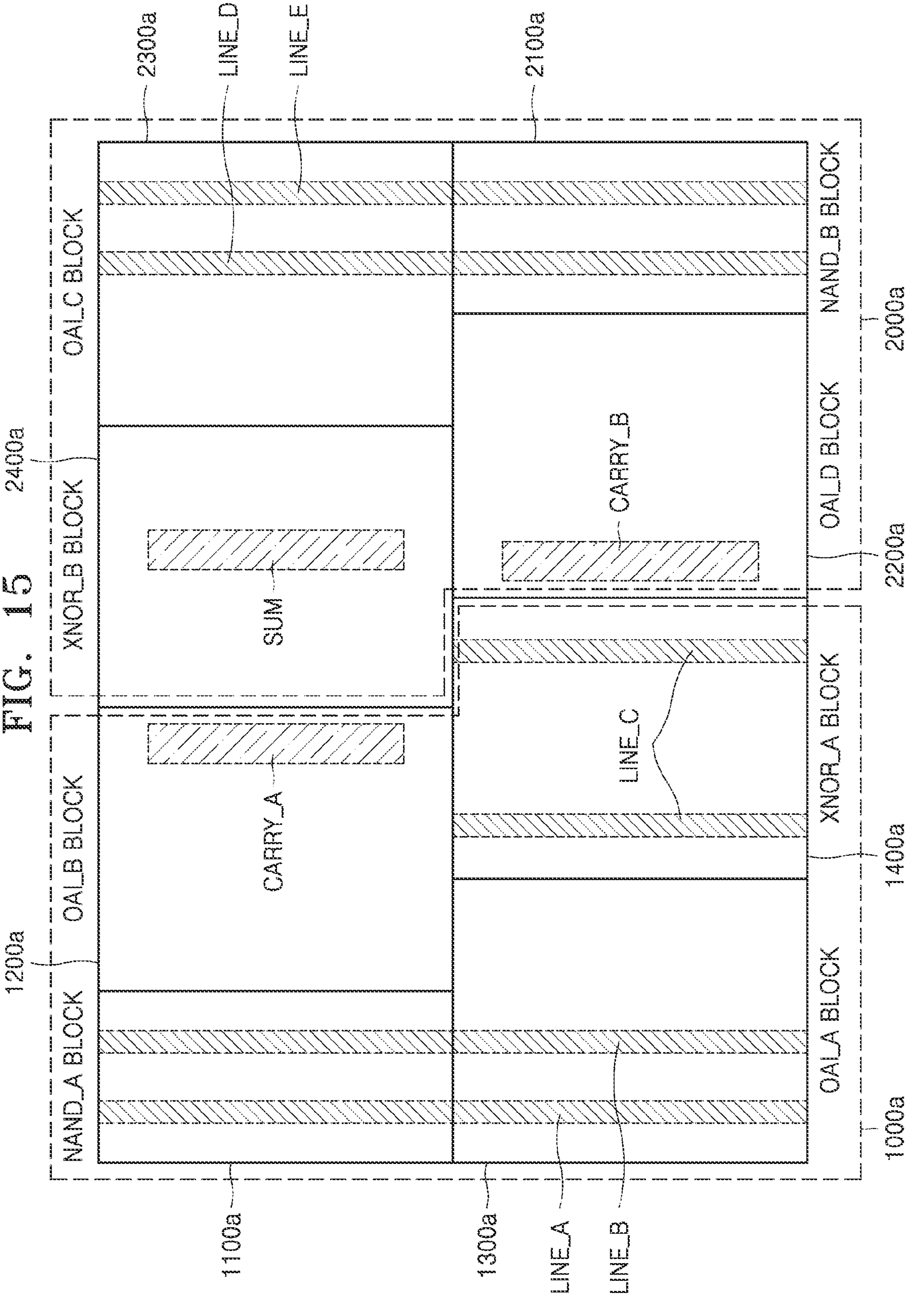
FIG. 15 is a diagram illustrating a layout of the 4-2 compressor integrated circuit according to the embodiment of FIG. 13.

FIG. 15 is a diagram illustrating a layout of the 4-2 compressor integrated circuit according to the embodiment of FIG. 13.

Referring to FIGS. 12 and 15, the layout of the 4-2 compressor integrated circuit may have a structure in which an integrated circuit of a first adder 1000$a$ and an integrated circuit of a second adder 2000$a$ are connected to each other. According to an embodiment, the integrated circuit of the first adder 1000$a$ and the integrated circuit of the second adder 2000$a$ may be connected (or coupled) to each other to have a symmetrical structure. In more detail, a first block group and a second block group of the first adder 1000$a$ may be stacked on different layers. In the second adder 2000$a$, logic gate blocks corresponding to the first block group of the first adder 1000$a$ may be stacked on the same layer as the second block group of the first adder 1000$a$. In the second adder 2000$a$, logic gate blocks corresponding to the second block group of the first adder 1000$a$ may be stacked on the same layer as the first block group of the first adder 1000$a$. Accordingly, in the 4-2 compressor integrated circuit, a circuit may be stacked in a region left as an empty space in the adder integrated circuit of FIG. 12, and thus, space may be efficiently utilized.

Referring to FIGS. 14 and 15, a second OAI block 1200$a$ of the first adder 1000$a$ may receive an inverted signal INPUT_CN of the third input signal INPUT_C through a first XNOR block 1400$a$ (e.g., XNOR_A), receive a first internal signal SIG_A through a first NAND block 1100$a$ (e.g., NAND_A), and receive a second internal signal SIG_B through a first OAI block 1300$a$ (e.g., OAI_A). The second OAI block 1200$a$ may generate a first carry signal CARRY_A based on the inverted signal INPUT_CN of the third input signal INPUT_C, the first internal signal SIG_A, and the second internal signal SIG_B. The first XNOR block 1400$a$ (e.g., XNOR_A) may generate an internal sum signal IN_SUM based on at least some of the third input signal INPUT_C, the inverted signal INPUT_CN of the third input signal INPUT_C, the second internal signal SIG_B, and an inverted signal of the second internal signal SIG_B. The first XNOR block 1400$a$ may provide the internal sum signal IN_SUM to the second adder 2000$a$.

The second adder 2000$a$ may receive one of a plurality of input signals from the first XNOR block 1400$a$ of the first adder 1000$a$. A second NAND block 2100$a$ (e.g., NAND_B) and a third OAI block 2300$a$ (e.g., OAI_C) of the second adder 2000$a$ may each receive a fourth input signal INPUT_D and a fifth input signal INPUT_E through a fourth input line and a fifth input line. A fourth OAI block 2200$a$ (e.g., OAI_D) may receive an inverted signal of the internal sum signal IN_SUM, receive a third internal signal SIG_C through the second NAND block 2100$a$, and receive a fourth internal signal SIG_D through the third OAI block 2300$a$. The fourth OAI block 2200$a$ may generate a second carry signal CARRY_B based on the inverted signal INPUT_CN of the third input signal INPUT_C, the third internal signal SIG_C, and the fourth internal signal SIG_D. A second XNOR block 2400$a$ (e.g., XNOR_B) may generate a sum signal SUM based on at least some of the internal sum signal IN_SUM, the inverted signal of the internal sum signal IN_SUM, the fourth internal signal SIG_D, and an inverted signal of the fourth internal signal SIG_D. The second XNOR block 2400$a$ may output the sum signal SUM to the outside.

Figure 16:
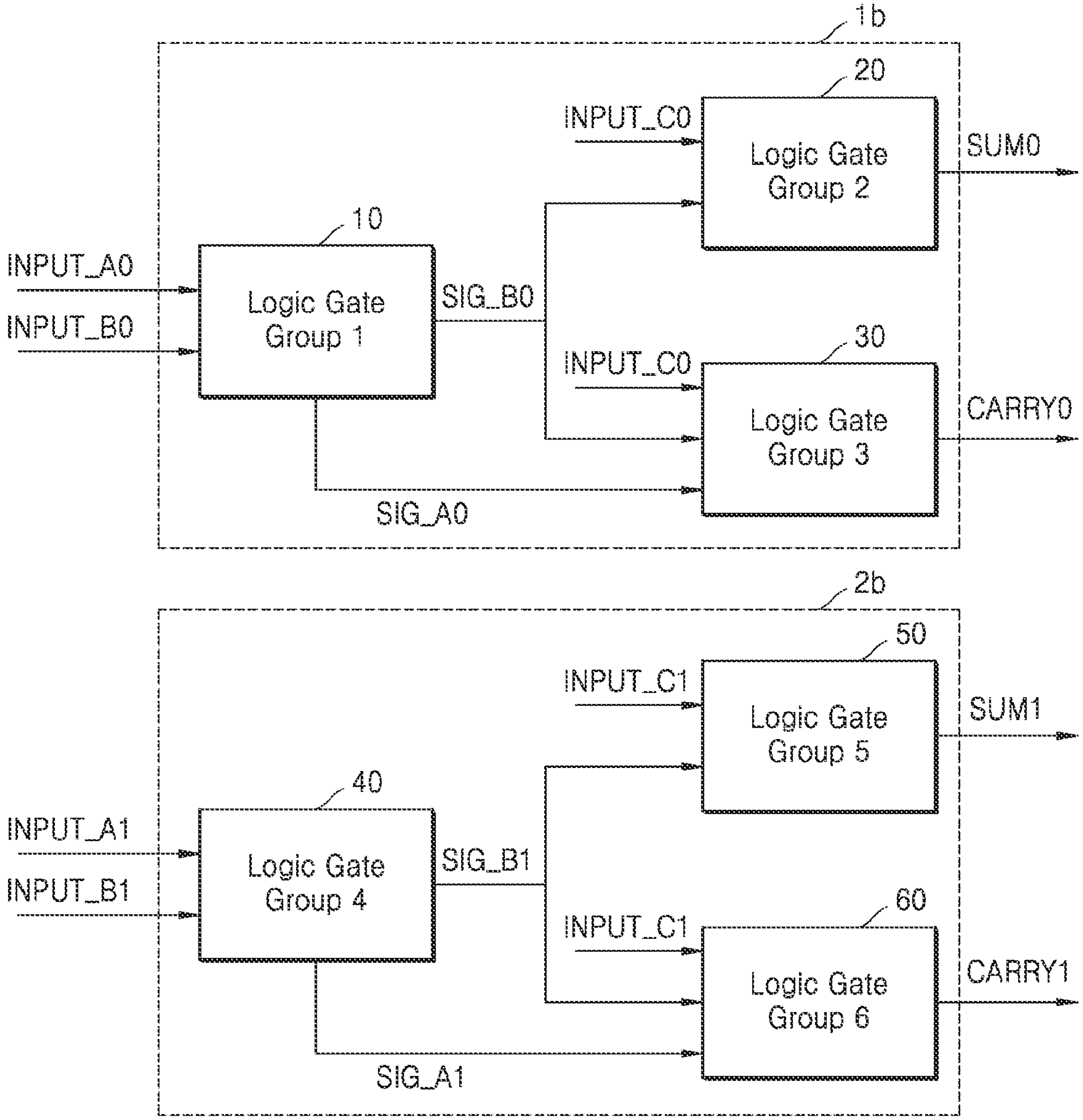
FIG. 16 is a block diagram illustrating logic gate groups of an adder integrated circuit configured in parallel according to an embodiment of the inventive concept.
Figure 17:
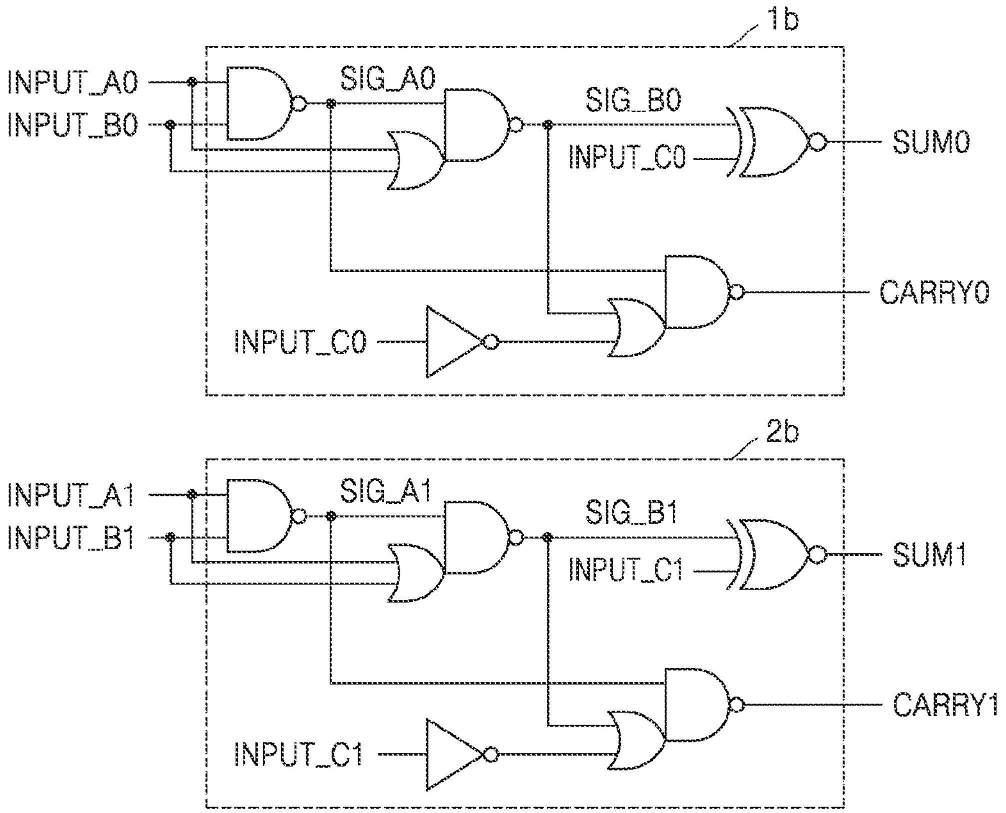
FIG. 17 is a block diagram illustrating logic gates in each of the logic gate groups according to the embodiment of FIG. 16.

FIG. 16 is a block diagram illustrating logic gate groups of an adder integrated circuit configured in parallel according to an embodiment of the inventive concept, and FIG. 17 is a block diagram illustrating logic gates in each of the logic gate groups according to the embodiment of FIG. 16.

Referring to FIG. 16, the adder integrated circuit according to the embodiment of the inventive concept may be an integrated circuit in which a plurality of adders, that is, a first adder 1$b$ and a second adder 2$b$, are arranged in parallel, and each of the first and second adders 1$b$ and 2$b$ may receive three input signals from the outside. The adder integrated circuit configured in parallel may output first and second sum signals SUM0 and SUM1 and first and second carry signals CARRY0 and CARRY1 in parallel for each adder. That is, unlike the 4-2 compressor integrated circuit of FIG. 13, the first adder 1$b$ may output the first sum signal SUM0 and the first carry signal CARRY0 based on a first input signal INPUT_A0 to a third input signal INPUT_C0 (e.g., INPUT_A0, INPUT_B0, and INPUT_C0), and the second adder 2$b$ may output the second sum signal SUM1 and the second carry signal CARRY1 based on a fourth input signal INPUT_A1 to a sixth input signal INPUT_C1 (e.g., INPUT_A1, INPUT_B1, and INPUT_C1).

Referring to FIG. 17, the adder integrated circuit according to an embodiment of the inventive concept may have a structure in which two adder integrated circuits described above with reference to FIG. 3 are arranged in parallel, and may independently output first and second sum signals SUM0 and SUM1 and first and second carry signals CARRY0 and CARRY1 for each adder. The first adder 1$a$ and the second adder 2$a$ may include the same logic gate, but may include different combinations of transistors, which perform the same function. For example, an XNOR gate in the first adder 1$a$ and an XNOR gate in the second adder 2$a$ may include different transistor combinations of different embodiments among the embodiments of FIGS. 7 to 11.

Figure 18:
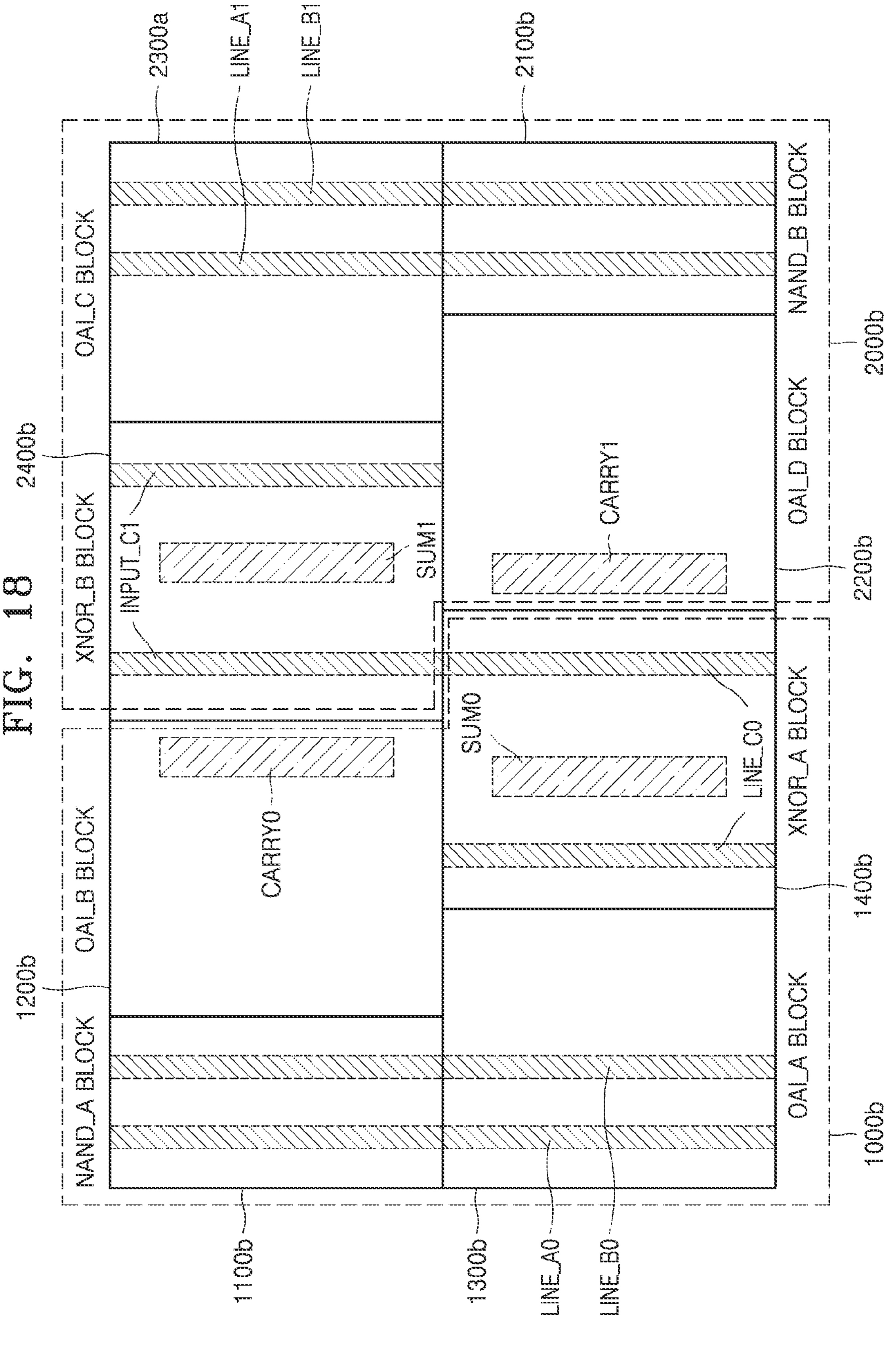
FIG. 18 is a diagram illustrating a layout of the adder integrated circuit according to the embodiment of FIG. 16.

FIG. 18 is a diagram illustrating a layout of the adder integrated circuit according to the embodiment of FIG. 16.

Referring to FIGS. 12 and 18, the layout of the adder integrated circuit may have a structure in which an integrated circuit of a first adder 1000$b$ and an integrated circuit of a second adder 2000$b$ are arranged adjacent to each other. According to an embodiment, the integrated circuit of the first adder 1000$b$ and the integrated circuit of the second adder 2000$b$ may be arranged symmetrical to each other. Because a structure in which the integrated circuit of the first adder 1000$b$ and the integrated circuit of the second adder 2000$b$ are arranged symmetrical to each other is the same as that described above in detail with reference to FIG. 15, detailed descriptions thereof are omitted.

Referring to FIGS. 17 and 18, a second OAI block 1200$b$ of the first adder 1000$b$ may receive an inverted signal of a third input signal INPUT_C0 through a first XNOR block 1400$b$, receive a first internal signal SIG_A0 through a first NAND block 1100$b$, and receive a second internal signal SIG_B0 through a first OAI block 1300$b$. The second OAI block 1200*b* may generate a first carry signal CARRY0 based on the inverted signal of the third input signal INPUT_C0, the first internal signal SIG_A0, and the second internal signal SIG_B0. The first XNOR block 1400*b* may generate a first sum signal SUM0 based on at least some of the third input signal INPUT_C0, the inverted signal of the third input signal INPUT_C0, the second internal signal SIG_B0, and an inverted signal of the second internal signal SIG_B0. The first XNOR block 1400*b* may output the first sum signal SUM0 to the outside.

Like the first adder 1000*b*, the second adder 2000*b* may receive three input signals from the outside and output a second sum signal SUM1 and a second carry signal CARRY1. A second NAND block 2100*b* and a third OAI block 2300*b* of the second adder 2000*b* may each receive a fourth input signal INPUT_A1 and a fifth input signal INPUT_B1 through a fourth input line LINE_A1 and a fifth input line LINE_B1. A fourth OAI block 2200*b* may receive an inverted signal of a sixth input signal INPUT_C1, receive a third internal signal SIG_A1 through the second NAND block 2100*b*, and receive a fourth internal signal SIG_B1 through the third OAI block 2300*b*. The fourth OAI block 2200*b* may generate a second carry signal CARRY1 based on the inverted signal of the sixth input signal INPUT_C1, the third internal signal SIG_A1, and the fourth internal signal SIG_B1. A second XNOR block 2400*b* may generate a second sum signal SUM1 based on at least some of the sixth input signal INPUT_C1, the inverted signal of the sixth input signal INPUT_C1, the fourth internal signal SIG_B1, and an inverted signal of the fourth internal signal SIG_B1. The second XNOR block 2400*b* may output the second sum signal SUM1 to the outside.

While the inventive concept has been particularly shown and described with reference to embodiments thereof, it will be understood that various changes in form and details may be made therein without departing from the spirit and scope of the following claims.

What is claimed is:

1. An integrated circuit comprising:

a first adder integrated circuit; and a second adder integrated circuit, wherein the first adder integrated circuit comprises:

a first logic gate group that outputs a first internal signal and a second internal signal based on a first input signal and a second input signal;

a second logic gate group that outputs a first sum signal based on the second internal signal and a third input signal; and a third logic gate group that outputs a first carry signal based on the first internal signal, the second internal signal, and the third input signal, wherein the second adder integrated circuit comprises:

a fourth logic gate group that outputs a third internal signal and a fourth internal signal based on a fourth input signal and a fifth input signal;

a fifth logic gate group that outputs a second sum signal based on the fourth internal signal and a sixth input signal; and a sixth logic gate group that outputs a second carry signal based on the third internal signal, the fourth internal signal, and the sixth input signal, wherein, in a layout of the integrated circuit, logic gates of the first logic gate group are housed in a first block group, logic gates of the second logic gate group and the third logic gate group are housed in a second block group, logic gates of the fourth logic gate group are housed in a third block group, and logic gates of the fifth logic gate group and the sixth logic gate group are housed in a fourth block group, wherein the first adder integrated circuit and the second adder integrated circuit are arranged adjacent to each other in the layout to have a symmetrical structure, in which the second block group is adjacent to the fourth block group and the second logic gate group and the fifth logic gate group are arranged adjacent to each other, and wherein, in the layout, the third logic gate group of the second block group and the fifth logic gate group of the fourth block group are arranged adjacent to each other in a first row, the second logic gate group of the second block group and the sixth logic gate group of the fourth block group are arranged adjacent to each other in a second row.

2. The integrated circuit of claim 1, wherein the first logic gate group comprises:

a first negative AND (NAND) gate that outputs the first internal signal by performing a NAND operation on the first input signal and the second input signal; and a first OR-AND-Inverter (OAI) gate that outputs, as the second internal signal, a result of performing an exclusive negative OR (XNOR) operation on the first input signal and the second input signal based on the first internal signal, the first input signal, and the second input signal.

3. The integrated circuit of claim 2, wherein the first OAI gate comprises:

a first OR gate that outputs a result of performing a first OR operation on the first input signal and the second input signal; and a second NAND gate that outputs the second internal signal by performing a NAND operation on the result of performing the first OR operation and the first internal signal.

4. The integrated circuit of claim 1, wherein the second logic gate group comprises an XNOR gate that outputs, as the first sum signal, a result of performing an XNOR operation on the second internal signal and the third input signal, wherein the XNOR gate comprises a first plurality of transistor groups and a second plurality of transistor groups.

5. The integrated circuit of claim 4, wherein the XNOR gate comprises a pass gate activated based on at least one of the third input signal and an inverted signal of the third input signal.

6. The integrated circuit of claim 4, wherein the XNOR gate comprises a plurality of transistor groups connected to one of power and ground.

7. The integrated circuit of claim 4, wherein the XNOR gate comprises:

a first pass gate that is activated when a logic state of the second internal signal is high, and outputs, as the first sum signal, a signal having a same logic state as the third input signal when activated; and a second pass gate that is activated when the logic state of the second internal signal is low, and outputs, as the first sum signal, a signal having a logic state inverted from that of the third input signal when activated.

8. The integrated circuit of claim 1, wherein the third logic gate group comprises:

an inverter that outputs an inverted signal of the third input signal; and a second OR-AND-Inverter (OAI) gate that outputs the first carry signal based on the inverted signal of the third input signal, the first internal signal, and the second internal signal.

9. The integrated circuit of claim 8, wherein the second OAI gate comprises:

a second OR gate that outputs a result of performing a second OR operation on the inverted signal of the third input signal and the second internal signal; and a third negative AND (NAND) gate that outputs the first carry signal by performing a NAND operation on the result of performing the second OR operation and the first internal signal.

10. The integrated circuit of claim 1, wherein the second logic gate group receives the third input signal through input lines disposed in the second block group and the second logic gate group generates an inverted signal of the third input signal received through one of the input lines.

11. A 4-2 compressor integrated circuit comprising:

a first adder that generates a first internal signal and a second internal signal with respect to a first input signal and a second input signal, outputs an internal sum bit, and outputs a first carry bit based on the first internal signal, the second internal signal, and a third input signal; and a second adder that generates a third internal signal and a fourth internal signal with respect to a fourth input signal and a fifth input signal, outputs a second carry bit based on the third internal signal, the fourth internal signal, and the internal sum bit of the first adder, and outputs a sum bit based on the internal sum bit and the fourth internal signal, wherein the first adder is housed in a first region in a layout of the 4-2 compressor integrated circuit and the second adder is housed in a second region in the layout, wherein the first region and the second region are arranged adjacent to each other to have a symmetrical structure, in which a first sub-region of the first region that outputs the internal sum bit and a third sub-region of the second region that outputs the sum bit are arranged adjacent to each other, wherein the first region further comprises a second sub-region that outputs the first carry bit, and the second region further comprises a fourth sub-region that outputs the second carry bit, and wherein, in the layout, the second sub-region of the first region and the third sub-region of the second region are arranged adjacent to each other in a first row, and the first sub-region of the first region and the fourth sub-region of the second region are arranged adjacent to each other in a second row.

12. The 4-2 compressor integrated circuit of claim 11, wherein the first adder comprises:

a first logic gate group that outputs the first internal signal and the second internal signal based on the first input signal and the second input signal;

a second logic gate group that outputs the internal sum bit based on the second internal signal and the third input signal; and a third logic gate group that outputs the first carry bit based on the first internal signal, the second internal signal, and the third input signal, wherein the first logic gate group, the second logic gate group, and the third logic gate group are housed in the first region.

13. The 4-2 compressor integrated circuit of claim 12, wherein the second adder comprises:

a fourth logic gate group that outputs the third internal signal and the fourth internal signal based on the fourth input signal and the fifth input signal;

a fifth logic gate group that outputs the sum bit based on the fourth internal signal and the internal sum bit; and a sixth logic gate group that outputs the second carry bit based on the third internal signal, the fourth internal signal, and the internal sum bit, wherein the fourth logic gate group, the fifth logic gate group, and the sixth logic gate group are housed in the second region.

14. The 4-2 compressor integrated circuit of claim 13, wherein the first region comprises a first negative AND (NAND) sub-region and a first OR-AND-Inverter (OAI) sub-region, wherein the second region comprises a second NAND sub-region and a third OAI sub-region, wherein the first logic gate group comprises:

a first negative AND (NAND) gate that is housed in the first NAND sub-region and outputs the first internal signal by performing a NAND operation on the first input signal and the second input signal; and a first OR-AND-Inverter (OAI) gate that is housed in the first OAI sub-region and outputs, as the second internal signal, a result of performing an exclusive negative OR (XNOR) operation on the first input signal and the second input signal based on the first internal signal, the first input signal, and the second input signal, and wherein the fourth logic gate group comprises:

a fourth NAND gate that is housed in the second NAND sub-region and outputs the third internal signal by performing a NAND operation on the fourth input signal and the fifth input signal; and a third OAI gate that is housed in the third OAI sub-region and outputs, as the fourth internal signal, a result of performing an XNOR operation on the fourth input signal and the fifth input signal based on the third internal signal, the fourth input signal, and the fifth input signal.

15. The 4-2 compressor integrated circuit of claim 14, wherein the first OAI gate comprises:

a first OR gate that outputs a result of performing a first OR operation on the first input signal and the second input signal; and a second NAND gate that outputs the second internal signal by performing a NAND operation on the result of performing the first OR operation and the first internal signal, and the third OAI gate comprises:

a third OR gate that outputs a result of performing a third OR operation on the fourth input signal and the fifth input signal; and a fifth NAND gate that outputs the fourth internal signal by performing a NAND operation on the result of performing the third OR operation and the third internal signal.

16. The 4-2 compressor integrated circuit of claim 14, wherein the first region further comprises a first exclusive negative OR (XNOR) sub-region, wherein the second logic gate group includes a first exclusive negative OR (XNOR) gate that is housed in the first XNOR sub-region and outputs, as the internal sum bit, a result of performing an XNOR operation on the second internal signal and the third input signal, wherein the first XNOR sub-region is the first sub-region of the first region.

17. The 4-2 compressor integrated circuit of claim 14, wherein the first region further comprises a second OAI sub-region, and wherein the second region further comprises a fourth OAI sub-region, wherein the third logic gate group comprises:

a first inverter that outputs an inverted signal of the third input signal; and a second OAI gate that outputs the first carry bit based on the inverted signal of the third input signal, the first internal signal, and the second internal signal, and the sixth logic gate group comprises:

a second inverter that outputs an inverted signal of the internal sum bit; and a fourth OAI gate that outputs the second carry bit based on the inverted signal of the internal sum bit, the third internal signal, and the fourth internal signal, wherein the first inverter and the second OAI gate are housed in the second OAI sub-region, the second inverter and the fourth OAI gate are housed in the fourth OAI sub-region, and the fourth OAI sub-region is the fourth sub-region of the second region.

18. The 4-2 compressor integrated circuit of claim 14, wherein the second region further comprises a second XNOR sub-region, wherein the fifth logic gate group includes a second XNOR gate that outputs, as the sum bit, a result of performing an XNOR operation on the fourth internal signal and the internal sum bit, wherein the second XNOR gate is housed in the second XNOR sub-region and the second XNOR sub-region is the third sub-region of the second region.

* * * * *